United States Patent
Huang et al.

(10) Patent No.: US 9,799,650 B2
(45) Date of Patent: Oct. 24, 2017

(54) SEMICONDUCTOR LAYOUT STRUCTURE

(71) Applicant: UNITED MICROELECTRONICS CORP., Hsin-Chu (TW)

(72) Inventors: Chun-Hsien Huang, Tainan (TW); Yu-Tse Kuo, Tainan (TW); Shu-Ru Wang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/043,614

(22) Filed: Feb. 14, 2016

(65) Prior Publication Data

US 2017/0200717 A1    Jul. 13, 2017

(30) Foreign Application Priority Data

Jan. 7, 2016    (CN) .......................... 2016 1 0008298

(51) Int. Cl.
| | |
|---|---|
| *H01L 27/088* | (2006.01) |
| *H01L 23/528* | (2006.01) |
| *H01L 23/522* | (2006.01) |
| *H01L 27/02* | (2006.01) |

(52) U.S. Cl.
CPC ........ *H01L 27/0886* (2013.01); *H01L 23/528* (2013.01); *H01L 23/5226* (2013.01); *H01L 27/0207* (2013.01)

(58) Field of Classification Search
CPC ......... H01L 21/76816; H01L 23/49838; H01L 23/528
USPC .... 257/206, 401, E29.07, E23.151, E23.175
See application file for complete search history.

(56) References Cited

U.S. PATENT DOCUMENTS

| | | | | |
|---|---|---|---|---|
| 5,650,975 A | * | 7/1997 | Hamade ............... | G11C 7/1048 365/222 |
| 8,482,083 B2 | * | 7/2013 | Osada ................... | G11C 11/412 257/379 |
| 9,029,230 B2 | | 5/2015 | Xiao et al. | |
| 9,349,436 B2 | * | 5/2016 | Liaw ..................... | G11C 11/412 |

* cited by examiner

*Primary Examiner* — Tan N Tran
(74) *Attorney, Agent, or Firm* — Winston Hsu

(57) ABSTRACT

A semiconductor layout structure includes at least a first signal line and a pair of Vss lines. The first signal line and the pair of Vss lines are extended along a first direction, and the Vss lines are arranged along a second direction. The first direction and the second direction are perpendicular to each other. The Vss lines are arranged at respective two sides of the first signal line.

18 Claims, 9 Drawing Sheets

SEMICONDUCTOR LAYOUT STRUCTURE

BACKGROUND OF THE INVENTION

1. Field of the Invention

The present invention relates to a semiconductor layout structure, and more particularly, to a semiconductor layout structure capable of adapting to multiple patterning technique in back-end-of-line (hereinafter abbreviated as BEOL) processing.

2. Description of the Prior Art

Fabrication of microstructures in semiconductor integrated circuits (hereinafter abbreviated as ICs) requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purposes, in conventional semiconductor techniques, a mask layer is formed on the material substrate/layers, and these tiny elements are defined in the mask layer and followed by being transferred to the objective material substrate/layers. Generally, the mask layer may include or is formed by means of a layer of photoresist that is patterned by lithographic process and/or patterned hard mask including the patterns transferred from the patterned photoresist. Since the dimensions of the patterns in sophisticated ICs are steadily decreasing, the equipment used for patterning devices features have to meet very stringent requirements with regard to resolution and overlay accuracy of the involved fabrication processes. In this respect, resolution is taken as a measure specifying the consistent ability to print minimum images under conditions of predefined manufacturing variations.

As feature sizes are decreased under 85 nanometers (hereinafter abbreviated as nm), the existing single patterning process has met its bottleneck to successfully produce the features. In order to push the lithographic limit further and to create even smaller, more densely packed devices, multiple patterning technology such as double patterning process, are being developed with presently available manufacturing equipment. Conventional multiple patterning process includes a litho-etching-litho-etching (hereinafter abbreviated as LELE) process, a litho-freeze-litho-etch (hereinafter abbreviated as LFLE) process, double patterning process, and a self-aligned double patterning (hereinafter abbreviated as SADP) process (also known as a spacer image transfer (hereinafter abbreviated as SIT) process).

Typically, the multiple patterning process is to decompose dense layout patterns into sub-patterns and then use two or more masks to print each sub-pattern. By transferring the sub-patterns to the photoresist layer/mask layer, the wanted patterns are re-constructed and obtained. It is found that the multiple patterning process gives rise to process control challenges. Thus, process complexity and process cost are unavoidably increased with the involvement of the multiple patterning process.

SUMMARY OF THE INVENTION

According to an aspect of the present invention, a semiconductor layout structure is provided. The semiconductor layout structure includes at least a first signal line extended along a first direction and a pair of Vss lines extended along the first direction. The Vss lines are arranged at respective two sides of the first signal line along a second direction. And the first direction and the second direction are perpendicular to each other.

According to another aspect of the present invention, a semiconductor layout structure is provided. The semiconductor layout structure includes two Vcc lines extended along a direction, two Vss lines extended along the direction, and a plurality of first signal lines extended and arranged along the direction. The two Vss lines are arranged in between the two Vcc lines, and the first signal lines are arranged in between the two Vss lines.

According to the semiconductor layout structures provided by the present invention, the Vcc lines, the Vss lines, and the first signal line(s) are arranged to form a "Vcc-Vss-the first signal line-Vss-Vcc" pattern. Consequently, spacing distances between the abovementioned Vcc/Vss lines and the first signal line are the same, and thus pattern designing for multiple patterning process can be simplified. Accordingly, the semiconductor layout structures provided by the present invention are able to lower process complexity and reduce process cost.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a method for forming a semiconductor layout structure provided by a preferred embodiment of the present invention, wherein FIG. 2 is a schematic drawing in a step subsequent to FIG. 1;

FIG. 3 is a schematic drawing in a step subsequent to FIG. 2;

FIG. 4 is a schematic drawing in a step subsequent to FIG. 3;

FIG. 5 is a schematic drawing in a step subsequent to FIG. 4;

FIG. 6 is a schematic drawing in a step subsequent to FIG. 5;

FIG. 7 is a schematic drawing in a step subsequent to FIG. 6;

FIG. 8 is a cross-sectional view taken along a line A-A' of FIG. 7; and

FIG. 9 is a cross-sectional view taken along a line B-B' of FIG. 7.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
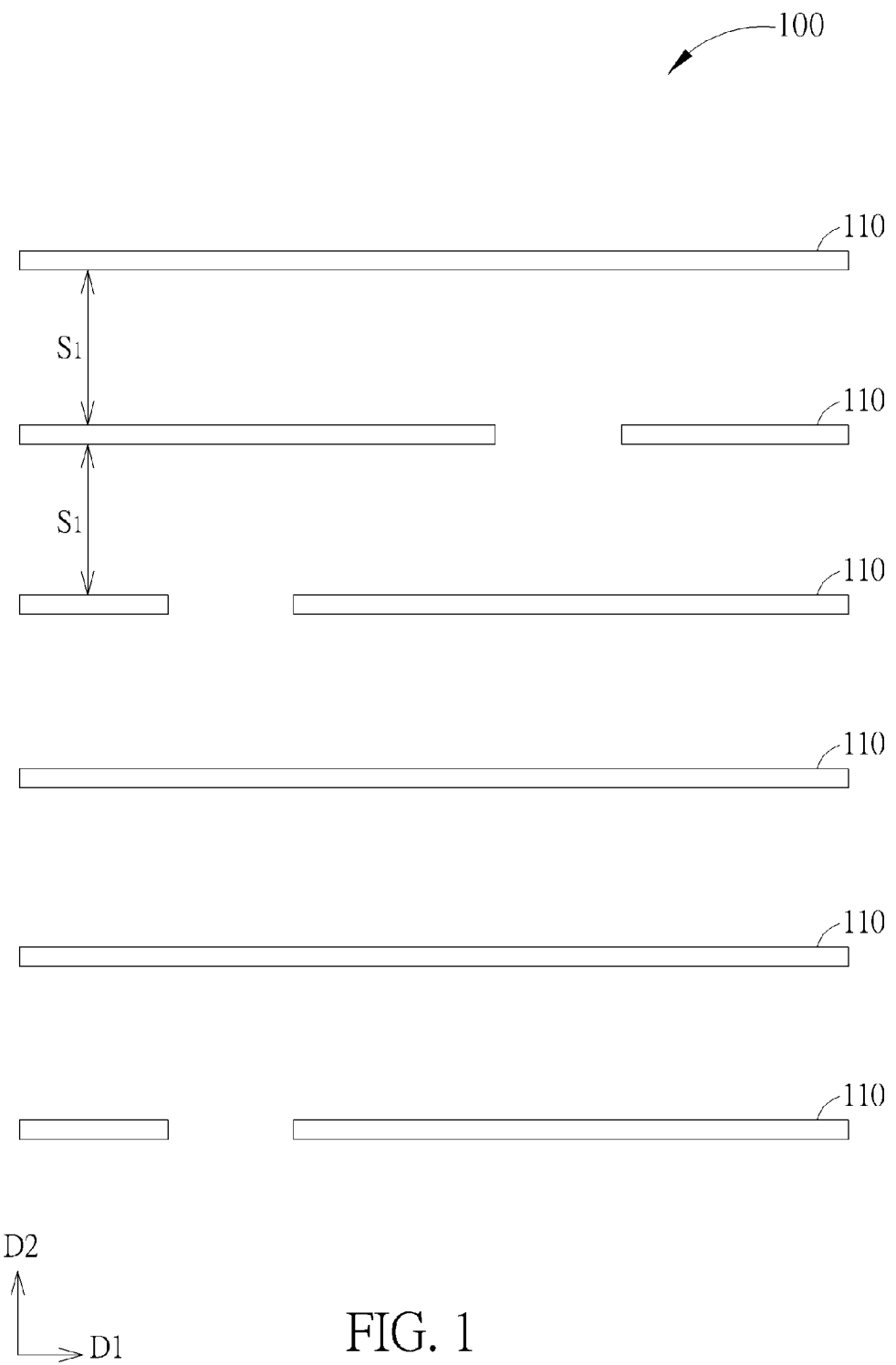

Conventional planar metal-oxide-semiconductor (MOS) transistor has difficulty when scaling down to 65 nm and beyond. Therefore the non-planar transistor technology such as Fin Field effect transistor (hereinafter abbreviated as FinFET) technology that allows smaller size and higher performance is developed to replace the planar transistor. Accordingly, the semiconductor layout structure provided by the preferred embodiment is exemplarily provided to form IC structure including non-planar FET device such as FinFET device, but not limited to this. Please refer to FIGS. 1-9, which are schematic drawings illustrating a method for forming a semiconductor layout structure provided by a preferred embodiment of the present invention. As shown in FIG. 1, a substrate 100, such as a silicon substrate, is provided. In the preferred embodiment, the substrate 100 can include a silicon-on-insulator (hereinafter abbreviated as SOI) substrate. It is well-known to those skilled in the art that the SOI substrate upwardly includes a silicon substrate, a bottom oxide (BOX) layer, and a semiconductor layer such as a single crystalline silicon layer formed on the BOX layer. Additionally, the substrate 100 provided by the preferred embodiment also can include a bulk silicon substrate. Furthermore, in some embodiments of the present invention, the substrate 100 may include another elementary semiconductor, such as germanium (Ge); a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Next, a patterned hard mask (not shown) is formed on the substrate 100 to define placement and size of a plurality of fins for at least an non-planar FET device. In the preferred embodiment, a fin pitch of the fins to be formed is beyond the capability of current single exposure lithography system and technology using 193 nm immersion lithography tool, and thus the multiple patterning process, such as a double patterning process is used to form the patterned hard mask defining the placement and the size for the fins. In some embodiments of the present invention, the double patterning process such as SADP process is used to form the fins: A plurality of mandrel patterns (not shown) are formed on the substrate 100, and a width of the mandrel patterns and/or spacing distance between the mandrel patterns are used to define a spacing distance between the fins to be formed. Next, a material layer is blanketly formed on the substrate 100, and an etching rate of the material layer is different from an etching rate of the mandrel patterns. The material layer is then etched back to form a plurality of spacers (not shown), and followed by removing the mandrel patterns. Consequently, a plurality of spacer patterns (not shown) are formed on the substrate 100, and the spacer patterns are used to define placement and size of fin patterns to be formed.

Please refer to FIG. 1. After forming the spacer patterns, the hard mask layer is patterned with the spacer patterns serving as a mask. Thus, a patterned hard mask (not shown) is formed and the substrate 100 is etched with the patterned hard mask serving as an etching mask. Consequently, a plurality of semiconductor structures that is a plurality of fin patterns 110 are formed on the substrate 100. As shown in FIG. 1, the fin patterns 110 are stripe patterns extended along a first direction D1. Also as shown in FIG. 1, the fin patterns 110 are arranged along a second direction D2. And the first direction D1 and the second direction D2 are perpendicular to each other. In the preferred embodiment, spacing distance $S_1$ between the fin patterns 100 is equal to the width of the mandrel patterns and the spacing distances between the spacer patterns.

Figure 2:
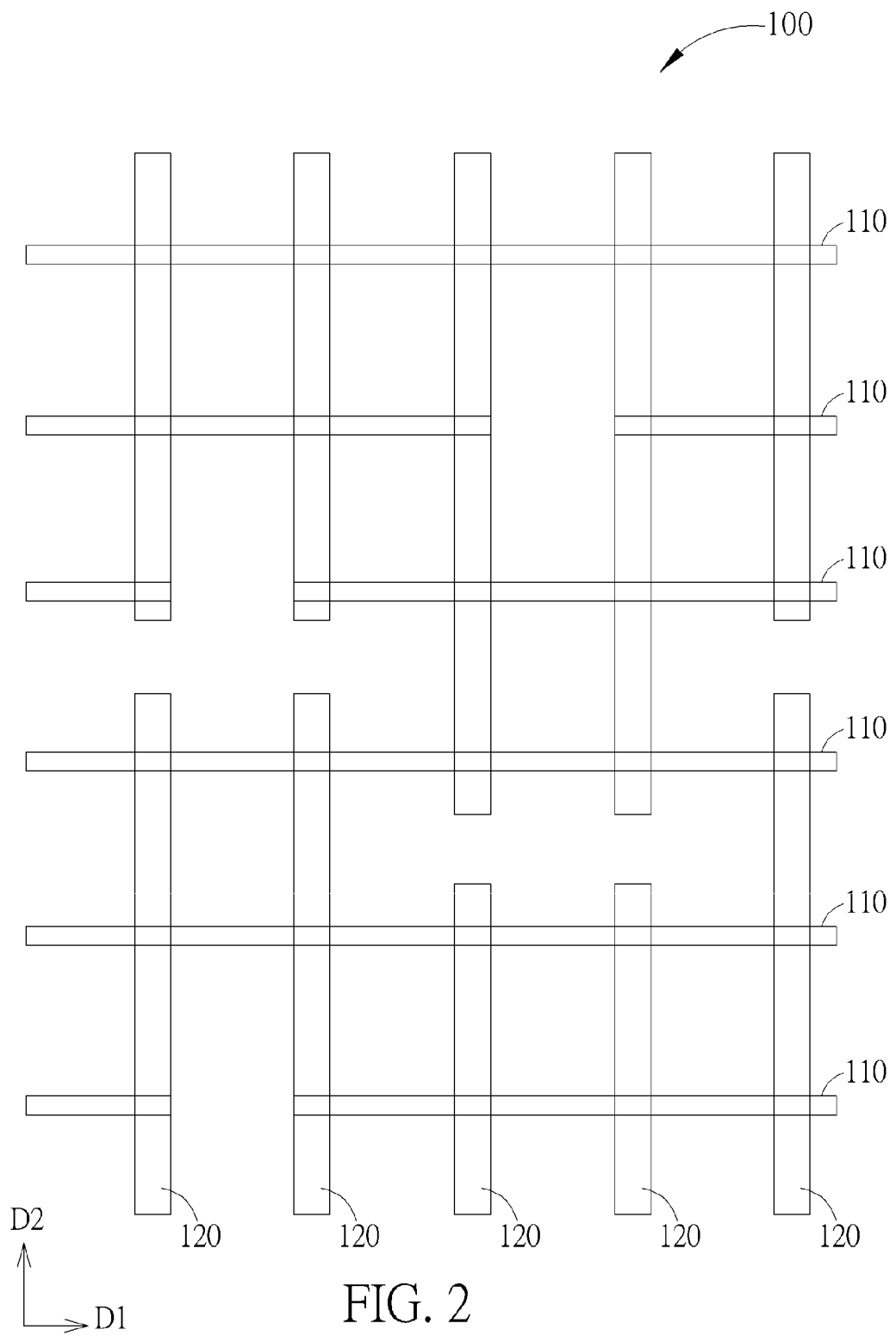

Please refer to FIG. 2. After forming the fin patterns 110, the patterned hard mask can be removed or left on the substrate 100 depending on different product and/or process requirements. Thereafter, a plurality of gate patterns 120 are formed on the substrate 100. The gate patterns 120 can be formed by single or multiple patterning process depending on different product and/or process requirements, and those details are omitted herein in the interest of brevity. As shown in FIG. 2, the gate patterns 120 are stripe patterns extended along the second direction D2. Also as shown in FIG. 2, the gate patterns 120 are arranged along the first direction D1. Furthermore, the gate patterns 120 cross the fin patterns 110 and thus overlap a portion of the fin patterns 110. The gate patterns 120 respectively include a gate dielectric layer (not shown) and a gate conductive layer (not shown). The gate dielectric layer includes the conventional dielectric material such as silicon oxide (SiO), silicon nitride (SiN), or silicon oxynitride (SiON). In some embodiments of the present invention, the gate dielectric layer can include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer includes the high-K dielectric material, the embodiments of the present invention can be further integrated to the metal gate process. Therefore control gate compatible to the high-K gate dielectric layer is obtained. Accordingly, the gate conductive layer can include different materials according to the gate-first or gate-last process. In some embodiments of the present invention which is integrated with gate-first process, the gate conductive layer includes metal such as tantalum (Ta), titanium (Ti), ruthenium (Ru), molybdenum (Mo), alloys of the aforementioned metals, metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate conductive layer can be a single-layered or multi-layered structure. In some embodiments of the present invention which is integrated with the gate-last process, the gate conductive layer serves as a dummy gate and includes semiconductor material such as polysilicon.

After forming the gate patterns 120, elements such as source/drain extension regions, spacers, and source/drain are formed and thus at least a FinFET device, that is, at least a non-planar transistor is obtained. It should be easily realized by those skilled in the art that in some embodiments of the present invention, a selective epitaxial growth (SEG) and/or salicide process can be integrated in the FinFET fabrication processing, and those details are omitted in the interest of brevity. Additionally, in those embodiments integrated with gate-last process, the dummy gate can be removed after forming the abovementioned elements and replaced with the required metal gates.

Figure 3:
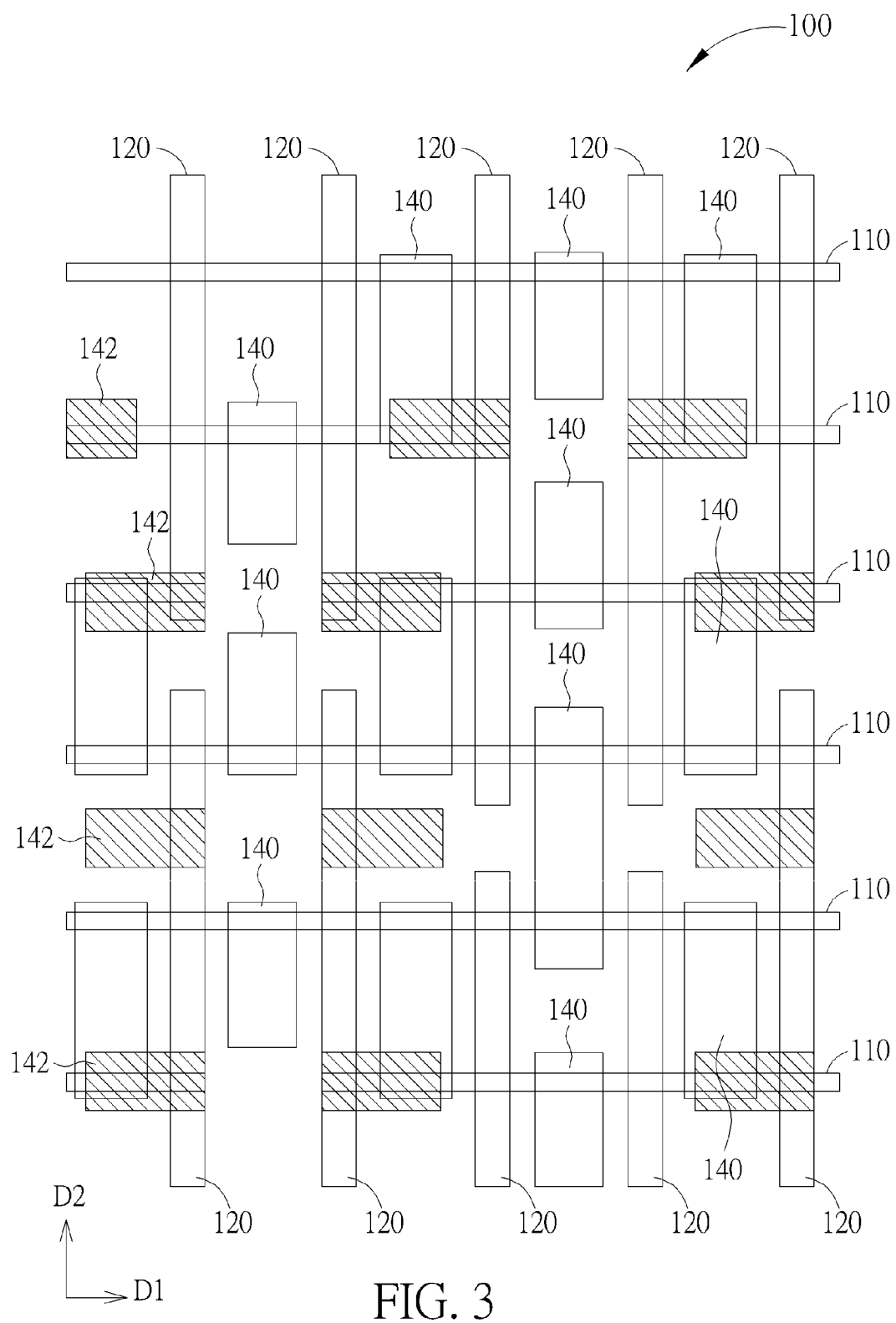

Please refer to FIG. 3. Next, an inter-layer dielectric (hereinafter abbreviated as ILD) layer 130 (shown in FIGS. 8 and 9) is formed on the substrate 100 and followed by forming a plurality of first contact patterns 140 and a plurality of second contact patterns 142 in the ILD layer 130. As shown in FIG. 3, the first contact patterns 140 are stripes patterns extended long the second direction D2. Also as shown in FIG. 3, the first contact patterns 140 are arranged along the first direction D1. More important, the first contact patterns 140 respectively cross and overlap one to two fin patterns 110, and the overlapped first contact patterns 140 and fin patterns are electrically connected. The second contact patterns 142 are extended along the first direction D1 and arranged along the second direction D2. More important, the second contact patterns 142 respectively cross and overlap the gate patterns 120, and the overlapped second contact patterns 142 and gate patterns 120 are electrically connected. The first contact patterns 140 and the second contact patterns 142 can be formed by the single patterning process or the multiple patterning process depending on different product and/or process requirements and those details are omitted for brevity. It is noteworthy that in some embodiments of the present invention, the first contact patterns 140 and the second contact patterns 142 are the lowest layer (the layer nearest to the substrate 100 and the FinFET device) of an interconnection structure. And thus the first contact patterns 140 and the second contact patterns 142 are taken as the zeroth metal layer M0 of the given interconnection structure.

Figure 4:
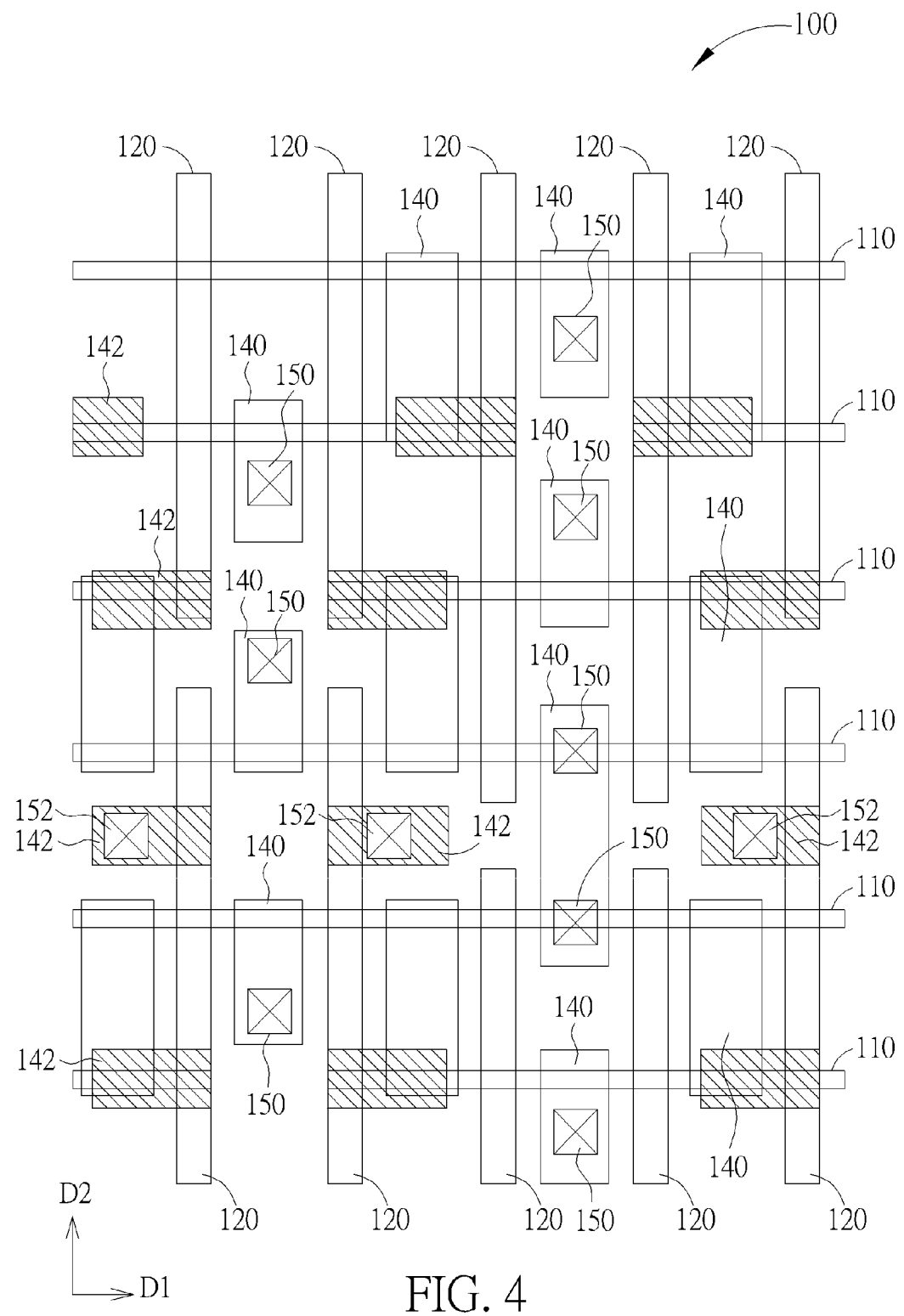

Please refer to FIG. 4. After forming the first contact patterns 140 and the second contact patterns 142, another dielectric layer 132 (shown in FIGS. 8 and 9) is formed on the ILD layer 130 and followed by forming a plurality of first via patterns 150 and a plurality of second via patterns 152. The first via patterns 150 and the second via patterns 152 can be formed by single patterning process, and the single patterning process may include an immersion DUV lithography or E-beam lithography, but not limited to this. Alternatively, the first via patterns 150 and the second via patterns 152 can be formed by the aforementioned multiple patterning process. As shown in FIG. 4, the first via patterns 150 overlap the first contact patterns 140, respectively. And the overlapped first via patterns 150 and first contact patterns 140 are electrically connected. The second via patterns 152 overlap the second contact patterns 142, respectively. And the overlapped second via patterns 152 and second contact patterns 142 are electrically connected. It is noteworthy that at least two of the first via patterns 150 overlap the same one first contact pattern 140, and the two first via patterns 150 also overlap two fin patterns 110 that are overlapped by the said first contact pattern 140 as shown in FIG. 4. In the preferred embodiment, the first via patterns 150 are provided to construct electrical connections between the first contact patterns 140 and other wires/lines. In the same concept, the second via patterns 152 are provided to construct electrical connections between the second contact patterns 142 and other wires/lines. Therefore, the first via patterns 150 and the second via patterns 152 are taken as the zeroth via plugs V0 of the given interconnection structure.

Figure 5:
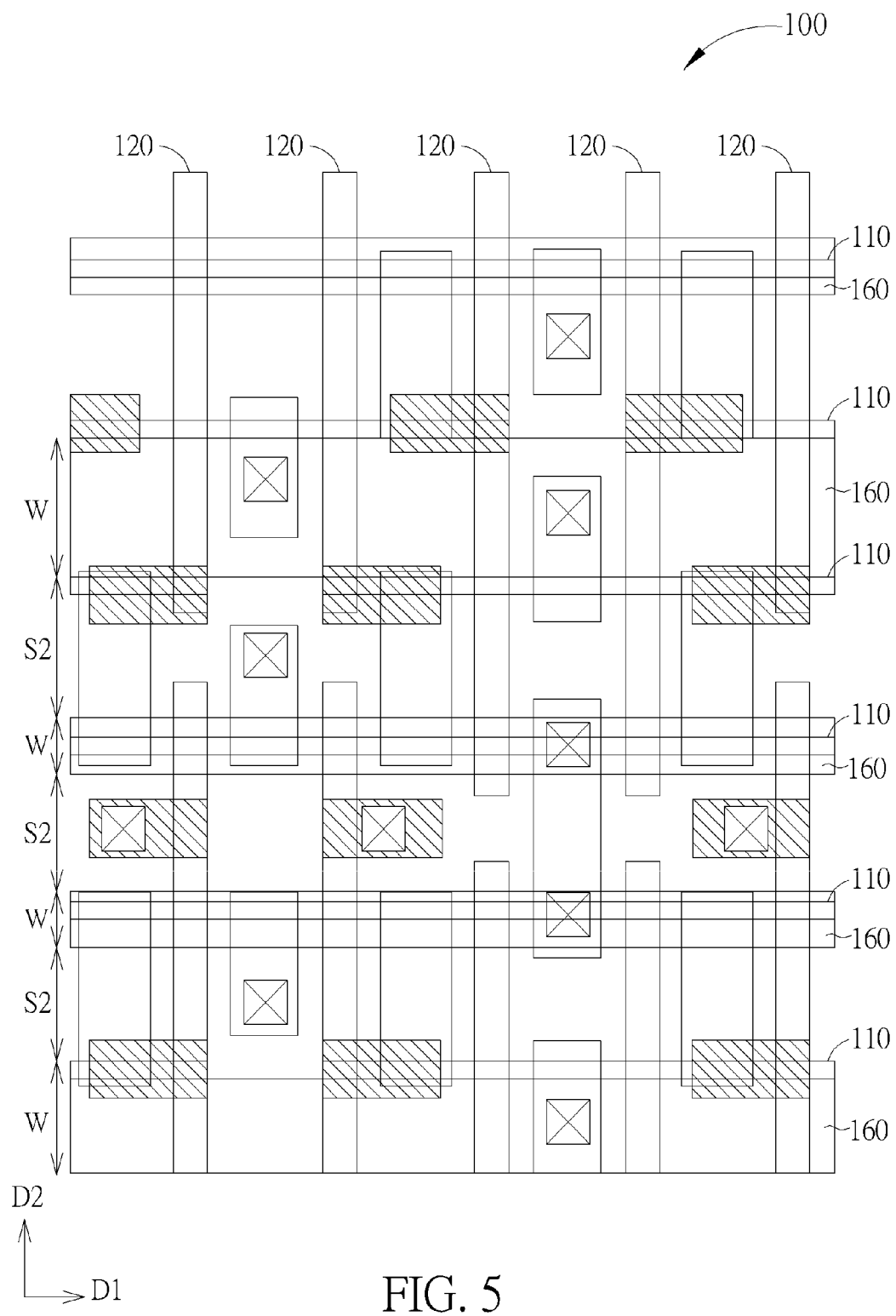

Please refer to FIG. 5. After forming the first via patterns 150 and the second via patterns 152, an interconnection structure can be formed on the substrate. For example, another dielectric layer 134 (shown in FIGS. 8 and 9) is formed on the dielectric layer 132 and followed by forming a patterned hard mask by the aforementioned SADP method. The patterned hard mask is formed to define metal lines of the interconnection structure. In some embodiments of the present invention, when the spacing distance between those metal lines is beyond the capability of current single exposure lithography system and technology, the multiple patterning process, such as the aforementioned SADP method is used to form the patterned hard mask defining the placement and the size of the metal lines. In detail, a plurality of mandrel patterns 160 is formed on the hard mask layer (not shown). As shown in FIG. 5, though width W of the mandrel patterns 160 are different, spacing distances $S_2$ between any two adjacent mandrel patterns 160 are all the same.

Figure 6:
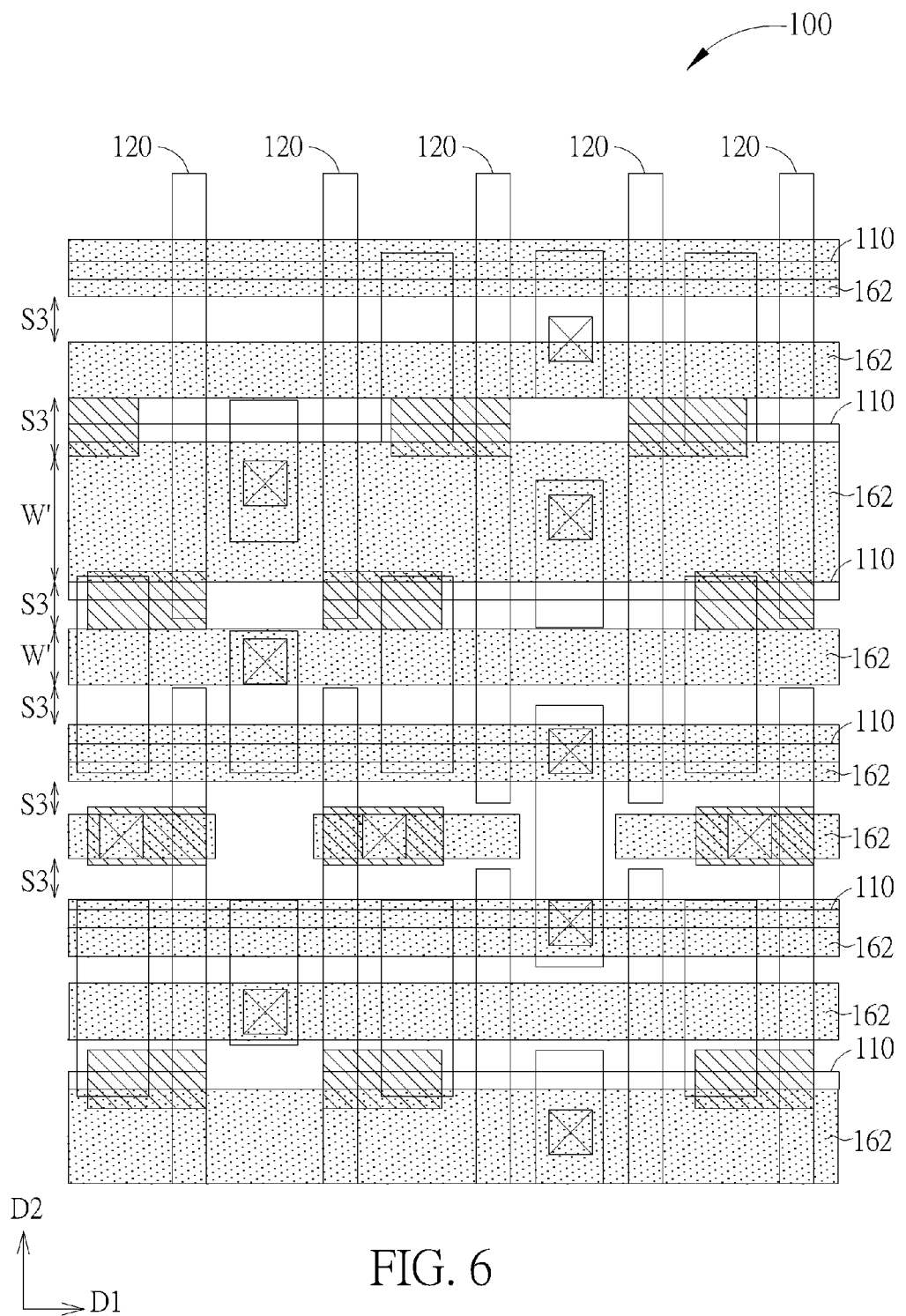

Please refer to FIG. 6. Next, a material layer (not shown) is blanketly formed on the mandrel patterns 160. And an etching rate of the material layer is different from an etching rate of the mandrel patterns 160. The material layer is then etched back to form a plurality of spacers on sidewalls of the mandrel patterns 160, and followed by removing the mandrel patterns 160. Consequently, a plurality of spacer patterns are obtained. It is noteworthy that widths $S_3$ of the spacer patterns are all the same. Furthermore, a plurality of blocking patterns (not shown) can be formed after removing the mandrel patterns 160. Then, the spacer patterns and the blocking patterns are transferred to the hard mask layer and thus a patterned hard mask is obtained. As shown in FIG. 6, the patterned hard mask includes a plurality of openings 162 for defining placement and size of a first metal layer of the interconnection structure. It is noteworthy that widths W' of the openings 162 may be the same with each other or, alternatively, different from each other, however spacing distances $S_3$ between the openings 162 (that is the width of the spacer patterns) are all the same. Furthermore, since the spacing distances $S_3$ between the openings 162 are all the same, the SADP method used to form the layout structure can be performed more smoothly and easily. Additionally, it is well-known to those skilled in the art that the blocking patterns are provide to cut the stripe-shaped patterns, therefore process window of the formation of the blocking patterns is further improved when the spacing distances $S_3$ are all the same.

Figure 7:
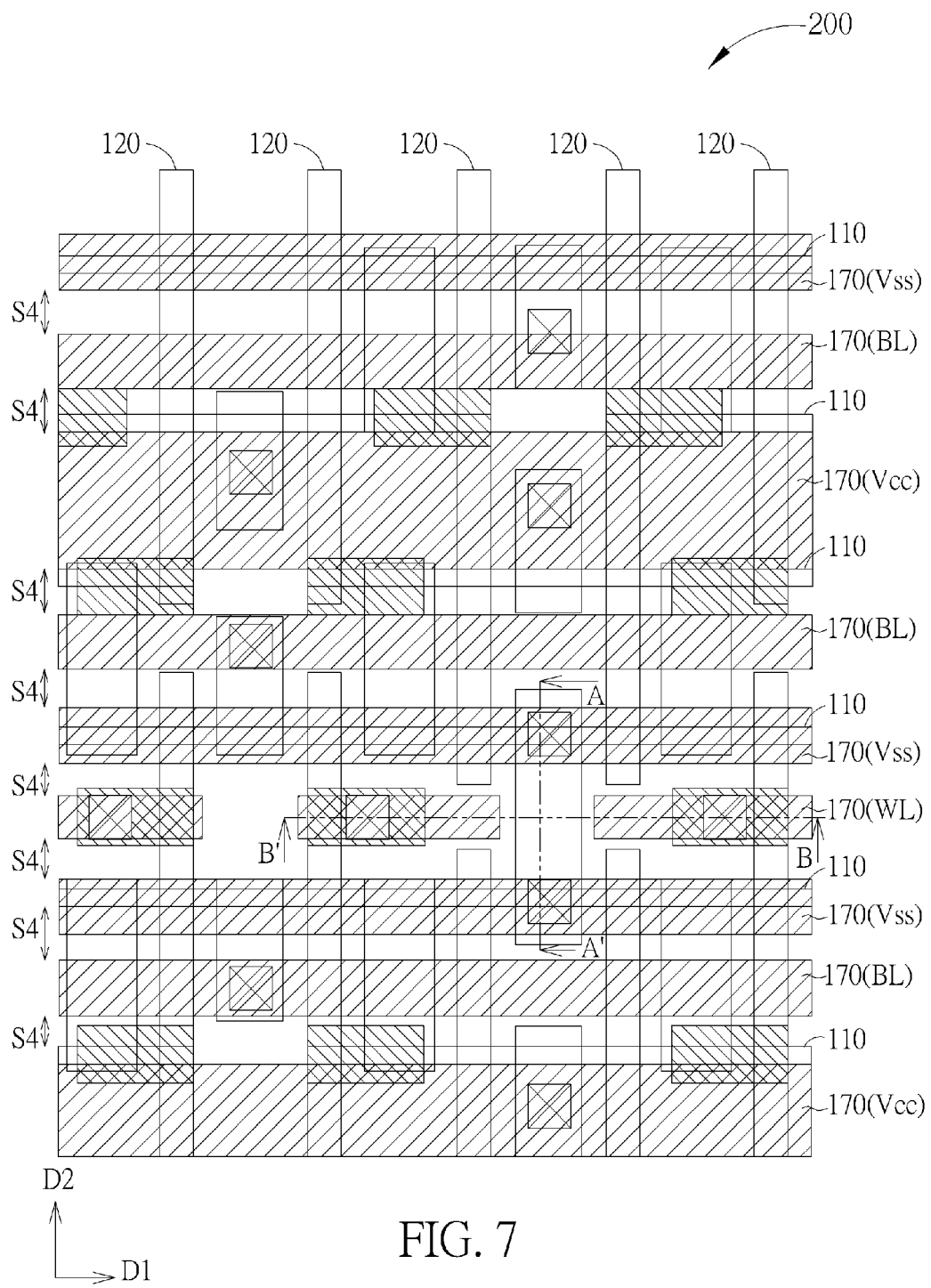
Figure 8:
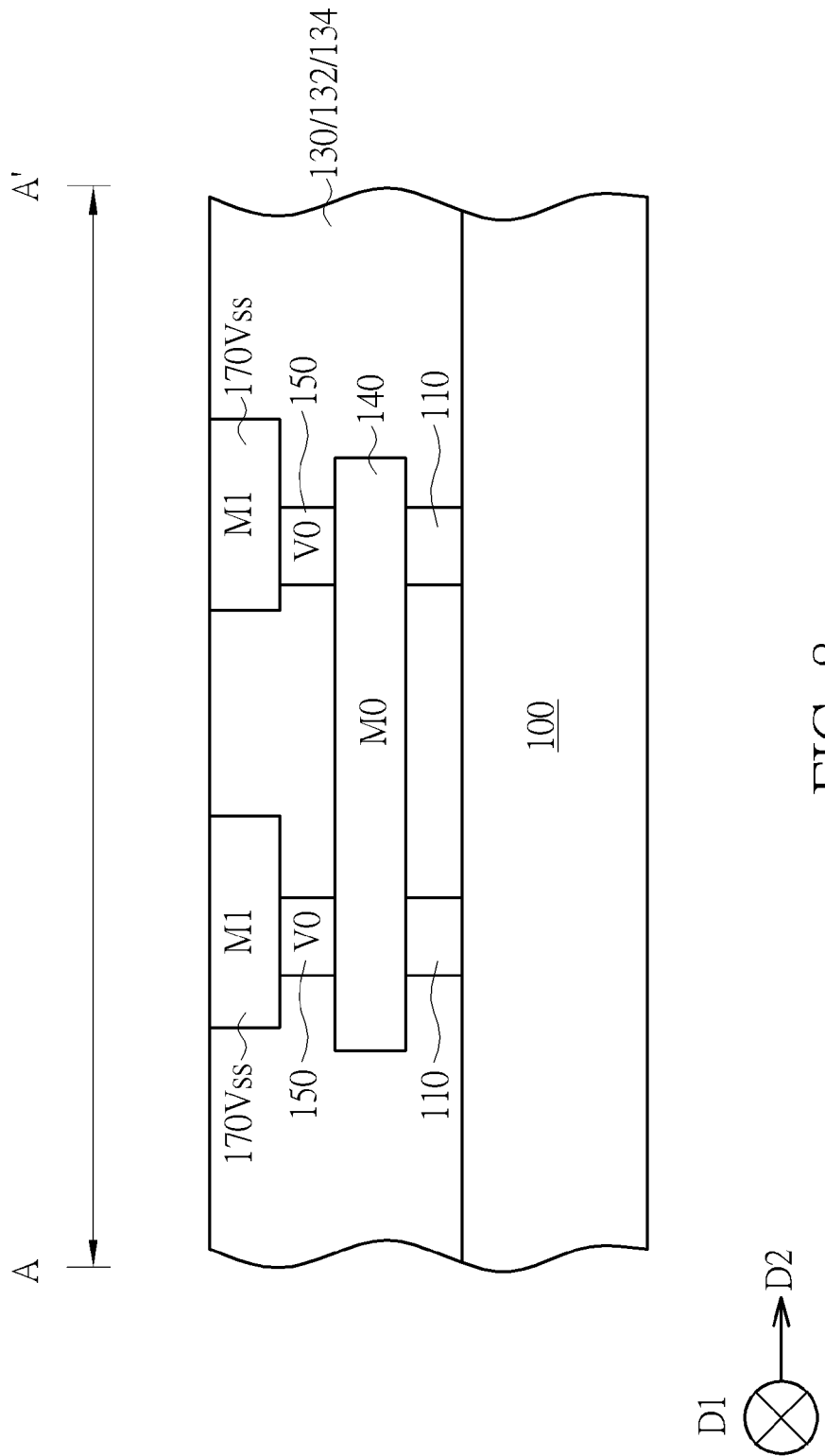
Figure 9:
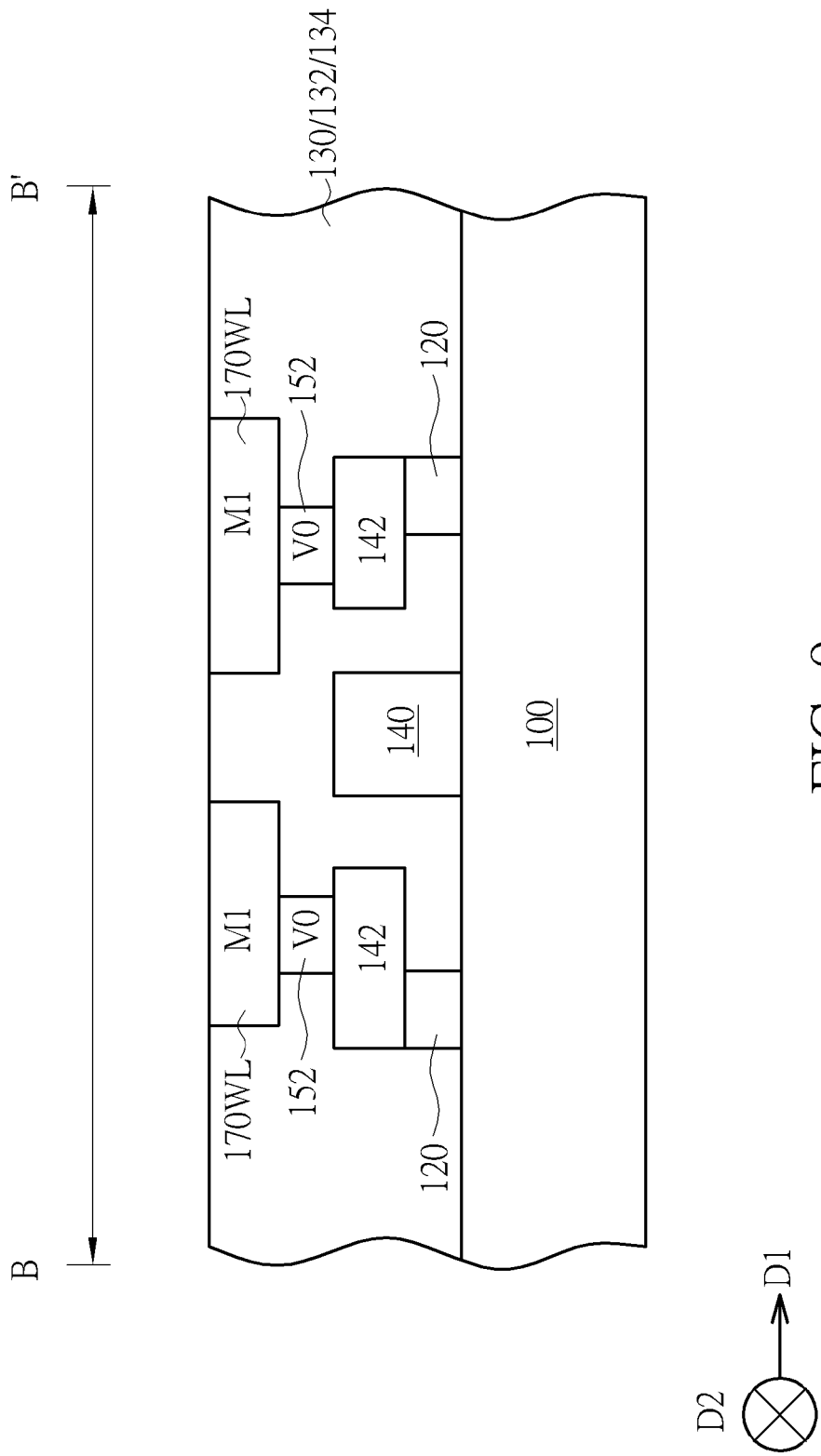

Please refer to FIGS. 7-9, wherein FIG. 8 is a cross-sectional view taken along a line A-A' of FIG. 7 and FIG. 9 is a cross-sectional view taken along a line B-B' of FIG. 7. As shown in FIG. 7, after forming the patterned hard mask including the openings 162, the dielectric layer 134 is etched and thus the openings 162 are transferred to the dielectric layer 134. Thereafter, a metal layer (not shown) is formed to fill up those openings and followed by performing a planarization. Consequently, superfluous metals are removed and thus a plurality of metal patterns 170 parallel with each other are formed in the dielectric layer 134. Accordingly, a semiconductor layout structure 200 is obtained. As shown in FIG. 7, the metal patterns 170 are extended along the first direction D1 and arranged along the second direction D2. It is noteworthy that the metal patterns 170 are taken as a first metal layers Ml of the abovementioned interconnection structure. And the metal patterns 170 are electrically connected to the first contact patterns 140 by the first via patterns 150, and to the second contact patterns 142 by the second via patterns 152. Furthermore, the metal patterns 170 are electrically connected to the FinFET device(s) by the first contact patterns 140 and the second contact patterns 142. Thereafter, steps for forming dielectric layers and metal layers (including wires and vias) can be repeated any number of times to obtain a desired BEOL interconnection structure.

Please refer to FIG. 7 again. It is noteworthy that the metal patterns 170 are further electrically connected to different voltage sources: the patterns extended along the first direction D1 and concurrently arranged along the first direction D1 are recognized and taken as first signal lines, and the first signals lines are electrically connected to a first signal. In the preferred embodiment, the first signal lines preferably are word lines, but not limited to this. In other words, first signal lines 170(WL) extended along the first direction D1 and also arranged along the first direction D1 are provided. A pair of metal patterns 170 immediately formed at respective two sides of the first signal line 170(WL) are electrically connected to Vss, and thus a pair of Vss lines 170(Vss) extended along the first direction D1 and arranged along the second direction D2 are provided. More important, the Vss lines 170(Vss) are formed at the respective two sides of the first signal line 170(WL) along the second direction D2. Furthermore, a pair of second signal lines extended along the first direction D1 and arranged along the second direction D2 are provided. In the preferred embodiment, the second signal lines preferably are bit lines, but not limited to this. In other words, a pair of second signal lines 170(BL) are provided and arranged at the respective two sides of the first signal line 170(WL) along the second direction D2. More important, "the Vss line 170(Vss)-the first signal lines 170(WL)-the Vss line 170(Vss)" structure is arranged in between the pair of the second signal lines 170(BL). It is therefore concluded that the Vss lines 170(Vss) are respectively arranged in between the first signal line 170(WL) and one of the second signal lines 170(BL). Furthermore, a pair of Vcc lines 170(Vcc) are provided. The Vcc lines 170(Vcc) are extended along the first direction D1 and arranged along the second direction D2. Furthermore, the Vcc lines 170 (Vcc) are formed at respective two sides of the first signal line 170(WL) along the second direction D2. More important, "the second signal line 170(BL)-the Vss line 170(Vss)-the first signal lines 170(WL)-the Vss line 170(Vss)-the second signal line 170(BL)" structure is arranged in between the pair of Vcc lines 170(Vcc). It is therefore concluded that the second signal lines 170(BL) respectively are arranged in between one of the Vss lines 170(Vss) and one of the Vcc lines 170(Vcc). Briefly speaking, in the semiconductor layout structure 200 provided by the preferred embodiment, the Vcc lines 170(Vcc), the second signal lines 170(BL), and the Vss lines 170(Vss) include a mirror symmetrical about the first signal lines 170(WL). Therefore, a "the Vcc line 170 (Vcc)-the second signal lines 170(BL)-the Vss line 170(Vss)-the first signal lines 170(WL)-the Vss line 170(Vss)-the second signal line 170(BL)-the Vcc line 170(Vcc)" structure is obtained. As shown in FIG. 8, the Vss lines 170(Vss) are arranged in between the pair of Vcc lines 170(Vcc) while the first signal lines 170(WL) are arranged in between the pair of Vss lines 170(Vss). More important, though width of the Vcc lines 170(Vcc) can be different from widths of the first signal lines 170(WL), the Vss lines 170(Vss) and the second signal lines 170(BL), the spacing distances $S_4$ between the first signal lines 170(WL), the Vss lines 170(Vss), the second signal lines 170(BL), and the Vcc lines 170(Vcc) along the second direction D2 are all the same. In other words, the spacing distances $S_4$ between the first metal layers Ml are all the same.

Please refer to FIGS. 7 and 8. The semiconductor layout structure 200 further includes at least two fin patterns 110 overlapped by the pair of Vss lines 170(Vss), and at least one first contact pattern 140 overlapping the two fin patterns 110. The semiconductor layout structure 200 further includes at least two first via patterns 150 respectively overlap the two fin patterns 150 that are overlapped by the pair of Vss lines 170(Vss) and the first contact pattern 140. Additionally, the two fin patterns 110 are electrically connected to the first metal layers Ml (the metal patterns 170) by the first contact pattern 140 and the first via patterns 150.

Please refer to FIGS. 7 and 9, the semiconductor layout structure 200 further includes a plurality of gate patterns 120, a plurality of second contact patterns 142 crossing and overlapping the gate patterns 120, and a plurality of second via patterns 152. The second via patterns 152 overlap the second contact patterns 142 as shown in FIG. 9. Additionally, the gate patterns 120 are electrically connected to the first metal layers Ml (the metal patterns 170) by the second contact patterns 142 and the second via patterns 152. Moreover, depths of the first contact patterns 140 and the second contact patterns 142 may be the same with each other or, alternatively, different from each other, however tops surface of the first contact patterns 140 and the second contact patterns 142 can be coplanar, but not limited to this.

It is also noteworthy that according to some embodiments of the present invention, the abovementioned semiconductor layout structure 200 can be a layout structure for a static random access memory (SRAM), particularly form a six-transistor SRAM (hereinafter abbreviated as 6T-SRAM). It is well-known to those skilled in the art that a 6T-SRAM cell includes two pull-up transistors, two pull-down transistors, and two access transistors. These six transistors constitute a set of flip-flops, and the pull-up transistors and pull-down transistors constitute a latch that stores data in the storage node.

Conventionally, the pull-up transistors of the 6T-SRAM cell are p-type metal oxide semiconductor (pMOS) transistors while the pull-down transistors and the access transistors are n-type metal oxide semiconductor (nMOS) transistors. One of the pull-up transistors and one of the pull-down transistors are electrically connected in series to constitute an inverter. One end of this inverter is electrically connected to the Vcc line 170(Vcc) and the other end is electrically connected to the Vss line 170(Vss). Equally, the other pull-up transistor and the other pull-down transistor are electrically connected in series to constitute another inverter. One end of this inverter is electrically connected to the Vcc line 170(Vcc) and the other end is electrically connected to the Vss line 170(Vss). The gates of the access transistors are electrically connected to the first signal lines 170(WL), and sources of the access transistors are electrically connected to the corresponding second signal lines 170(BL).

According to the semiconductor layout structure 200 provided by the present invention, because the Vss lines 170(Vss) are arranged at the two respective sides of the first signal line 170(WL), the Vss lines 170(Vss) can be electrically connected to one 6T-SRAM cell or to different 6T-SRAM cells. Briefly speaking, according to the semiconductor layout structure 200 provided by the present invention, both of 6T-SRAM design flexibility and fabrication reliability are improved.

According to the semiconductor layout structures provided by the present invention, the Vcc lines, the Vss lines, and the first signal line(s) are arranged to form a "Vcc-Vss-the first signal line(s)-Vss-Vcc" pattern. Consequently, spacing distances between the abovementioned Vcc/Vss lines and the first signal line are made all the same, and thus pattern designing for multiple patterning process can be simplified. Accordingly, the semiconductor layout structures provided by the present invention are able to lower process complexity and reduce process cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor layout structure comprising:
   at least a first signal line extended along a first direction;
   a pair of Vss lines extended along the first direction, the Vss lines being arranged at respective two sides of the first signal line along a second direction, and the first direction and the second direction being perpendicular to each other; and
   a plurality of fin patterns extended along the first direction, wherein the fin patterns comprise a material different from the Vss lines and the first signal line, and each of the fin patterns protrudes from a substrate, wherein one of the fin patterns is disposed between one of the Vss lines and the substrate in a thickness direction of the substrate.

2. The semiconductor layout structure according to claim 1, further comprising a pair of second signal lines extended along the first direction, and the second signal lines being arranged at the respective two sides of the first signal line along the second direction.

3. The semiconductor layout structure according to claim 2, wherein the Vss lines are respectively arranged in between the first signal line and one of the second signal lines.

4. The semiconductor layout structure according to claim 2, wherein spacing distances between the first signal line, the Vss lines, and the second signal lines are all the same.

5. The semiconductor layout structure according to claim 2, further comprising a pair of Vcc lines extended along the first direction, and the Vcc lines being arranged at the respective two sides of the first signal line along the second direction.

6. The semiconductor layout structure according to claim 5, wherein the second signal lines are respectively arranged in one of the Vss lines and one of the Vcc lines.

7. The semiconductor layout structure according to claim 5, wherein the Vcc lines, the second signal lines, and the Vss lines comprise a mirror symmetry symmetrical about the first signal line.

8. The semiconductor layout structure according to claim 1, wherein the Vss lines overlap at least two fin patterns of the plurality of fin patterns.

9. The semiconductor layout structure according to claim 8, further comprising a first contact pattern extended along the second direction, and the first contact pattern overlapping the two fin patterns overlapped by the Vss lines.

10. The semiconductor layout structure according to claim 9, further comprising at least a two first via patterns overlapping the two fin patterns overlapped by the Vss line, the first contact pattern, and the Vss lines.

11. The semiconductor layout structure according to claim 1, further comprising a plurality of gate patterns extended along the second direction.

12. The semiconductor layout structure according to claim 11, further comprising a plurality of second contact patterns extended along the first direction, and the second contact respectively crossing the gate patterns.

13. The semiconductor layout structure according to claim 12, further comprising a plurality of second via patterns overlapping the second contact patterns, respectively.

14. A semiconductor layout structure comprising:
    two Vcc lines extended along a direction;
    two Vss lines extended along the direction, and the Vss lines being arranged in between the two Vcc lines;
    a plurality of first signal lines extended and arranged along the direction, and the first signal lines being arranged in between the two Vss lines, wherein each of the first signal lines is a word line; and
    at least two fin patterns extended along the first direction, wherein the fin patterns and the Vss lines comprise different materials.

15. The semiconductor layout structure according to claim 14, further comprising a plurality of second signal lines extended along the direction, the second signal lines respectively being arranged in between one of the two Vcc lines and one of the two Vss lines.

16. The semiconductor layout structure according to claim 15, wherein spacing distances between the first signal lines, the second signal lines, and the Vcc lines are the same.

17. The semiconductor layout structure according to claim 14, wherein the two Vss lines overlap the two fin patterns, respectively.

18. The semiconductor layout structure according to claim 17, further comprising two via patterns, and the two Vss lines overlapping the two via patterns and the two fin patterns, respectively.

* * * * *